(12) United States Patent
Chan et al.

(10) Patent No.: US 12,543,548 B2
(45) Date of Patent: Feb. 3, 2026

(54) SEMICONDUCTOR STRUCTURE AND METHOD FOR FORMING THE SAME

(71) Applicant: UNITED MICROELECTRONICS CORP., Hsin-Chu (TW)

(72) Inventors: Ang Chan, Taipei (TW); Hsin-Jung Liu, Pingtung County (TW); Kun-Ju Li, Tainan (TW); Chau-Chung Hou, Tainan (TW); Fu-Shou Tsai, Keelung (TW); Yu-Lung Shih, Tainan (TW); Jhih-Yuan Chen, Kaohsiung (TW); Chun-Han Chen, Hsinchu (TW); Wei-Xin Gao, Tainan (TW); Shih-Ming Lin, Taipei (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 1024 days.

(21) Appl. No.: 17/494,809

(22) Filed: Oct. 5, 2021

(65) Prior Publication Data
US 2023/0051000 A1    Feb. 16, 2023

(30) Foreign Application Priority Data
Aug. 16, 2021 (CN) .......................... 202110935534.3

(51) Int. Cl.
| | | |
|---|---|---|
| H01L 23/522 | (2006.01) | |
| H01L 21/768 | (2006.01) | |
| H01L 23/532 | (2006.01) | |
| H10B 61/00 | (2023.01) | |
| H10B 63/00 | (2023.01) | |

(52) U.S. Cl.
CPC .... *H01L 23/5226* (2013.01); *H01L 21/76816* (2013.01); *H01L 21/7684* (2013.01); *H01L 21/76843* (2013.01); *H01L 21/76865* (2013.01); *H01L 21/76877* (2013.01); *H01L 23/53266* (2013.01); *H10B 61/10* (2023.02); *H10B 63/80* (2023.02)

(58) Field of Classification Search
CPC ....... H01L 21/76816; H01L 21/46843–76849; H01L 21/7684; H01L 21/76865; H01L 21/76877–76883; H01L 23/5226; H01L 21/76888
See application file for complete search history.

(56) References Cited

U.S. PATENT DOCUMENTS

| | | |
|---|---|---|
| 8,486,587 B2 | 7/2013 | Tsai |
| 9,275,933 B2 | 3/2016 | Kuo |
| 9,748,139 B1 | 8/2017 | Liou |
| 9,761,791 B2 | 9/2017 | Shiu |
| 10,090,465 B2 | 10/2018 | Hsu |

(Continued)

*Primary Examiner* — Yu Chen
(74) *Attorney, Agent, or Firm* — Winston Hsu (57) ABSTRACT

A semiconductor structure includes a first dielectric layer on a substrate, a conductive structure disposed in the first dielectric layer and including a terminal portion and an extending portion connecting the terminal portion and extending away from the terminal portion, a second dielectric layer disposed on the first dielectric layer, a conductive via through the second dielectric layer and directly contacting the extending portion, and a dummy via through the second dielectric layer and directly contacting the terminal portion. In a cross-sectional view, a width of the dummy via is smaller than 50% of a width of the conductive via.

8 Claims, 11 Drawing Sheets

(56) References Cited

U.S. PATENT DOCUMENTS

| | | |
|---|---|---|
| 10,840,437 B2 | 11/2020 | Hung |
| 10,985,271 B2 | 4/2021 | Yang |
| 11,081,579 B2 | 8/2021 | Chang |
| 11,239,327 B2 | 2/2022 | Lee |
| 11,264,492 B2 | 3/2022 | Huang |
| 11,296,214 B2 | 4/2022 | Lee |
| 2013/0207276 A1* | 8/2013 | Tseng .................. H01L 21/7684 257/E21.585 |
| 2017/0062338 A1* | 3/2017 | Liu ..................... H01L 23/5226 |
| 2017/0213790 A1* | 7/2017 | Wang ................ H01L 21/76804 |
| 2017/0331031 A1 | 11/2017 | Bak |
| 2022/0336351 A1* | 10/2022 | Zhu ..................... H01L 23/5283 |

* cited by examiner

FIG. 9

SEMICONDUCTOR STRUCTURE AND METHOD FOR FORMING THE SAME

BACKGROUND OF THE INVENTION

1. Field of the Invention

The present invention relates to a semiconductor structure and a method for forming the same. More particularly, the present invention relates to a semiconductor structure including a dummy via disposed on a terminal portion of a conductive structure and a method for forming the same.

2. Description of the Prior Art

In semiconductor manufacturing, the conductive structures such as contact plugs for vertical electrical interconnection of a semiconductor device are usually formed by a chemical mechanical polishing (CMP) process. However, during the CMP process, when the metal materials exposed to the polishing slurry have different electrical potentials, galvanic corrosion may occur between the metal materials, which may cause excessive removal of the metal materials and poor interconnection quality.

SUMMARY OF THE INVENTION

In light of the above, the present invention is directed to provide a semiconductor structure and a method for forming the same, which may reduce the risk of excessive removal of the metal materials of the conductive vias on a conductive structure by forming at least a dummy via with a width smaller than 50% of a width the conductive vias on a terminal portion of the conductive structure. An improved interconnection quality of the semiconductor structure may be obtained.

According to an embodiment of the present invention, a semiconductor structure includes a first dielectric layer on a substrate, a conductive structure disposed in the first dielectric layer and including a terminal portion and an extending portion connecting the terminal portion and extending away from the terminal portion, a second dielectric layer disposed on the first dielectric layer, a conductive via through the second dielectric layer and directly contacting the extending portion, and a dummy via through the second dielectric layer and directly contacting the terminal portion. A width of the dummy via is smaller than 50% of a width of the conductive via in a cross-sectional view.

According to another embodiment of the present invention, a method for forming a semiconductor structure includes the steps of forming a conductive structure in a first dielectric layer, wherein the conductive structure comprises an terminal portion and an extending portion connecting the terminal portion and extending away from the terminal portion; forming a second dielectric layer on the first dielectric layer; forming a first opening through the second dielectric layer directly above the extending portion and a second opening through the second dielectric layer directly above terminal portion, wherein a width of the second opening is smaller than 50% of a width of the first opening in a cross-sectional view; forming a conductive material layer on the second dielectric layer and completely filling the first opening and the second opening; and performing a chemical mechanical polishing process to remove the conductive material layer outside the first opening and the second opening to obtain a conductive via in the first opening and a dummy via in the second opening.

These and other objectives of the present invention will no doubt become obvious to those of ordinary skill in the art after reading the following detailed description of the preferred embodiment that is illustrated in the various figures and drawings.

DETAILED DESCRIPTION

FIG. 1, FIG. 2, FIG. 3, FIG. 5, FIG. 6, FIG. 7 and FIG. 8 are schematic cross-sectional diagrams illustrating a semiconductor structure at different steps of a manufacturing process according to an embodiment of the present invention. FIG. 4 is a schematic cross-sectional diagram illustrating a semiconductor structure at the step shown in FIG. 3 according to another embodiment of the present invention.

Figure 1:
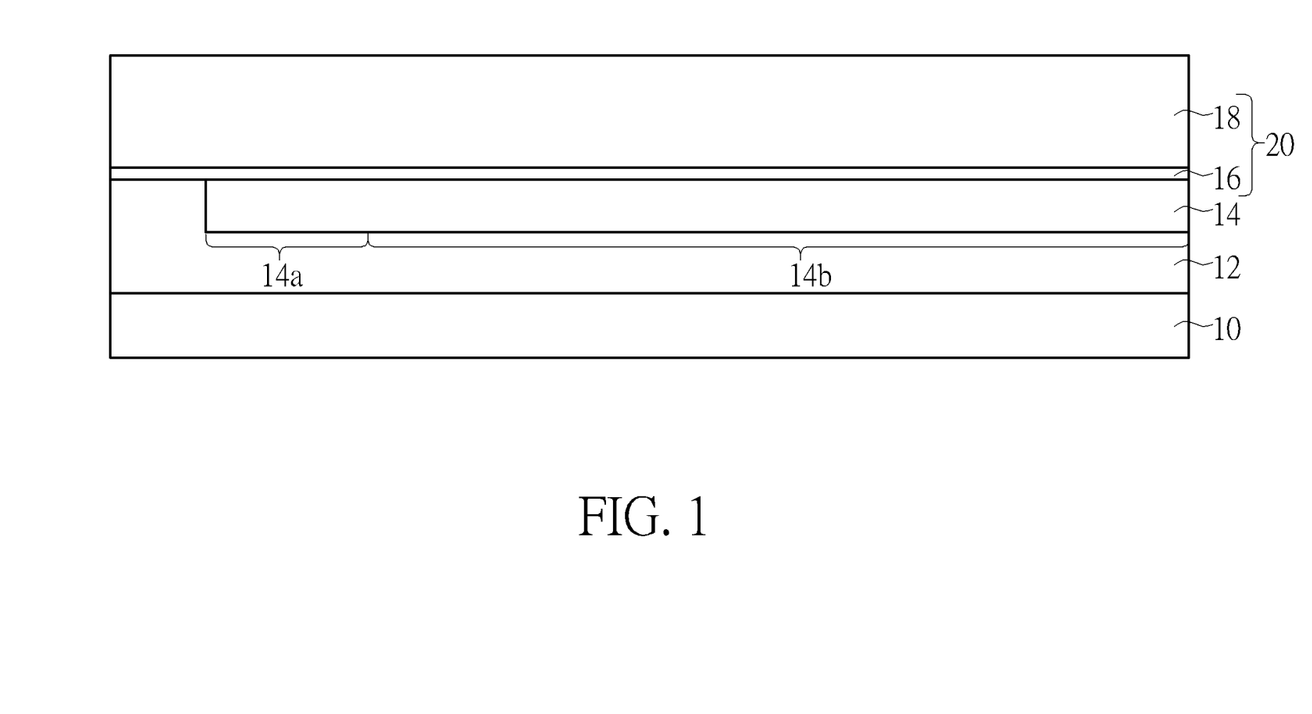
FIG. 1, FIG. 2, FIG. 3, FIG. 5, FIG. 6, FIG. 7 and FIG. 8 are schematic cross-sectional diagrams illustrating a semiconductor structure at different steps of a manufacturing process according to an embodiment of the present invention.

Please refer to FIG. 1. A substrate 10 is provided. A first dielectric layer 12 is formed on the substrate 10. A conductive structure 14 is formed in the first dielectric layer 12. As shown in FIG. 1, the conductive structure 14 includes a terminal portion 14a and an extending portion 14b connecting a side of the terminal portion 14a and extending away from the terminal portion 14a. In other words, the conductive structure 14 may extend along a horizontal plane and terminates at the terminal portion 14a.

The substrate 10 may include a silicon substrate, a silicon germanium (SiGe) substrate, a silicon carbide (SiC) substrate, a silicon-on-insulator (SOI) substrate, a III-V semiconductor substrate, or a substrate made of other suitable materials. A plurality of semiconductor devises 104 may be formed in the substrate 102. The substrate 10 may include isolation structures, active regions, and semiconductor devices such as transistors, diodes, memories, light-emitting devices, resistors, capacitors, inductors formed therein. For the sake of simplicity, these structures and/or devices in the substrate 10 are not shown in the drawings.

The first dielectric layer 12 may include silicon oxide ($SiO_2$) or low-k dielectric materials with dielectric constants smaller than the dielectric constant of silicon oxide (the dielectric constant of silicon oxide is around 3.9). According to some embodiments, an interlayer dielectric layer may be disposed between the substrate 10 and the first dielectric layer 12, and conductive structures may be formed in the interlayer dielectric layer to electrically connect the devices of the substrate 10. For the sake of simplicity, interlayer dielectric layer is not shown in the drawings.

The conductive structure 14 may be a conductive line or a conductive plate in any width for horizontal interconnection. The conductive structure 14 may include metal materials, such as cobalt (Co), copper (Cu), aluminum (Al), tungsten (W), nickel (Ni), platinum (Pt), tantalum (Ta), titanium (Ti), a compound of the above materials, a composite layer or an alloy of the above materials, but are not limited thereto. According to an embodiment of the present invention, the conductive structure 14 includes copper (Cu).

Please continue to refer to FIG. 1. A second dielectric layer 20 is then formed on the first dielectric layer 12. According to an embodiment of the present invention, the second dielectric layer 20 may include an etching stop layer 16 and a dielectric material layer 18 on the etching stop layer 16. The dielectric material layer 18 may include silicon oxide ($SiO_2$) or low-k dielectric materials with dielectric constants smaller than the dielectric constant of silicon oxide. The etching stop layer 16 may include a dielectric material different from the material of the dielectric material layer 18. According to an embodiment of the present invention, the etching stop layer 16 may include silicon nitride (SiN), silicon oxynitride (SiON), silicon carbon nitride (SiCN), nitride doped silicon carbide (NDC), but is not limited thereto.

Figure 2:
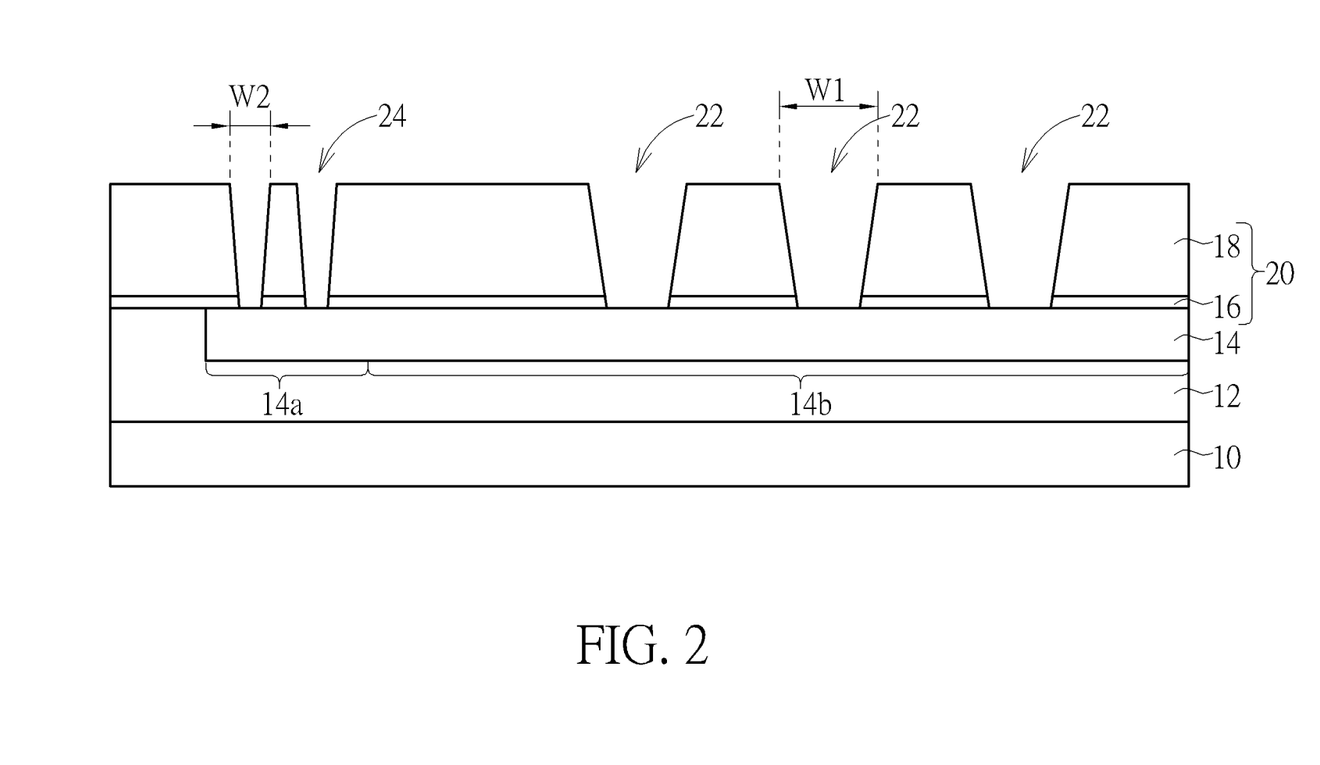

Please refer to FIG. 2. Subsequently, a patterning process (such as photolithography-etching process) may be performed to form first openings 22 and second openings 24 through the second dielectric layer 20. The first openings 22 are directly over the extending portion 14b of the conductive structure 14. The second openings 24 are directly over the terminal portion 14a of the conductive structure 14. As shown in FIG. 2, the first openings 22 have a first width W1, and the second openings 24 have a second width W2. The second width W2 is smaller than 50% of the first width W1 in the cross-sectional view as shown in FIG. 2. According to an embodiment of the present invention, the width W2 is between 20% and 40% of the first width W1. According to an embodiment of the present invention, the first width W1 may be approximately 55 nm, the second width W2 may be any width smaller than 27 nm, such as between 11 nm and 22 nm.

Figure 3:
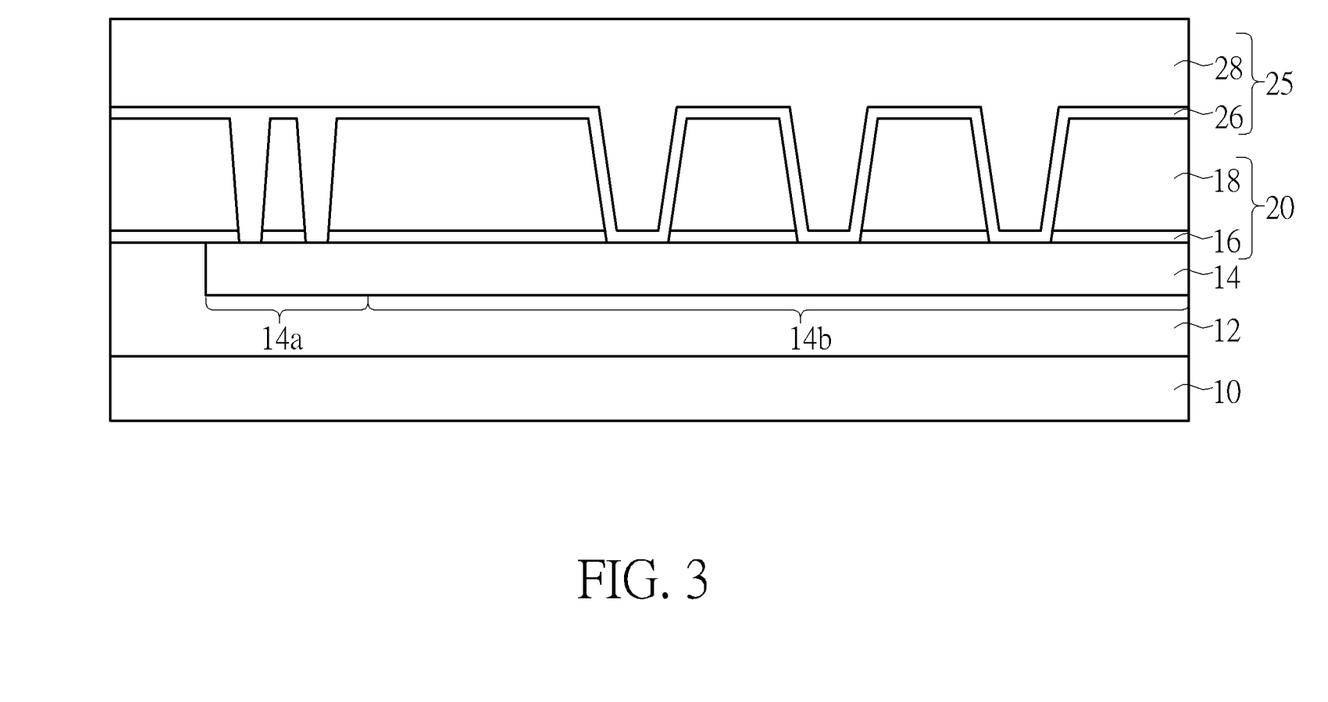
Figure 4:
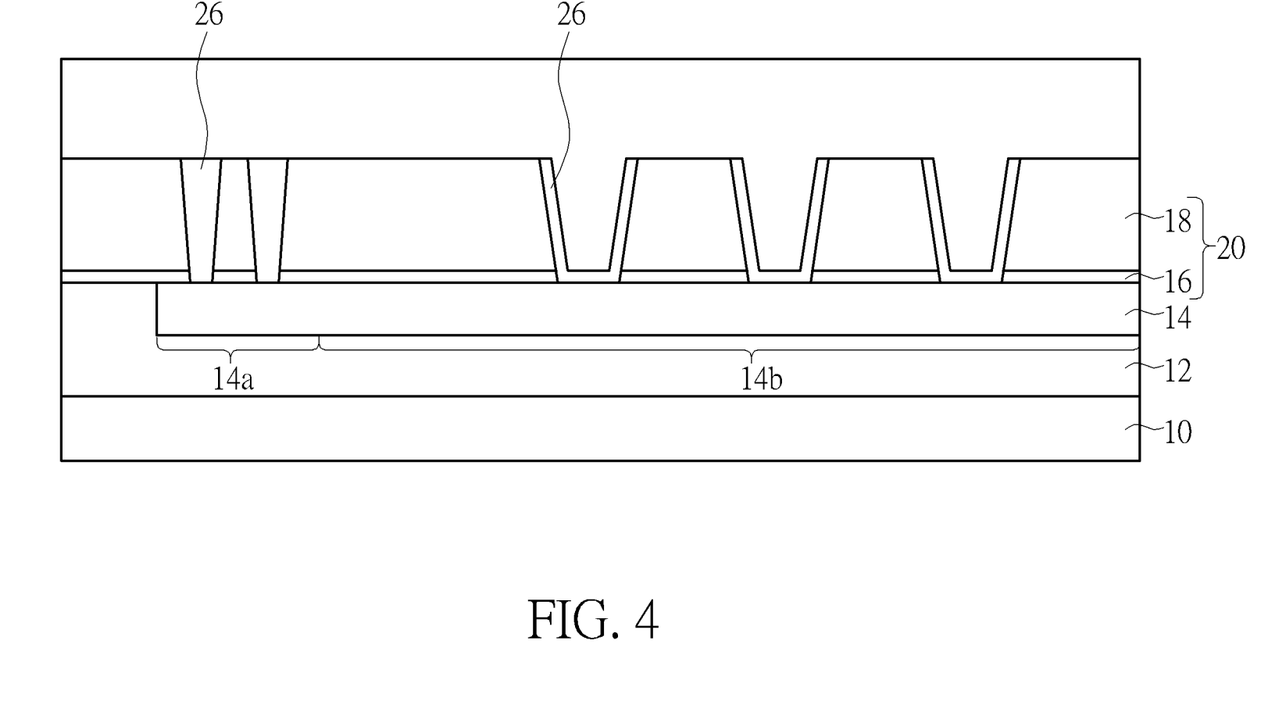
FIG. 4 is a schematic cross-sectional diagram illustrating a semiconductor structure at the step shown in FIG. 3 according to another embodiment of the present invention.

Please refer to FIG. 3. Subsequently, a deposition process such as chemical vapor deposition (CVD), physical vapor deposition (PVD) or atomic layer deposition (ALD) may be performed to form a conductive material layer 25 on the second dielectric layer 20. According to an embodiment of the present invention, the conductive material layer 25 is formed by forming a first metal layer 26 on the second dielectric layer 20 and covering along a surface of the second dielectric layer 20 (that is, the surface of the dielectric material layer 18) and sidewalls and bottom surfaces of the first openings 22, and then forming a second metal layer 28 on the first metal layer 26. It should be noted that the second openings 24 are mostly or completely filled by the first metal layer 26, and the first openings 22 are completely filled by the second metal layer 28. According to an embodiment of the present invention, the material of the first metal layer 26 may include titanium nitride (TiN), and the material of the second metal layer 28 may include tungsten (W).

According to an embodiment of the present invention, as shown in FIG. 4, After forming the first metal layer 26, an etching process may be performed to remove the first metal layer 26 outside the first openings 22 and the second openings 24 until the surface of the second dielectric layer 20 (that is, the surface of the dielectric material layer 18) is exposed. The second metal layer 28 is then formed and may in direct contact with the second dielectric layer 20 (the dielectric material layer 18).

Figure 5:
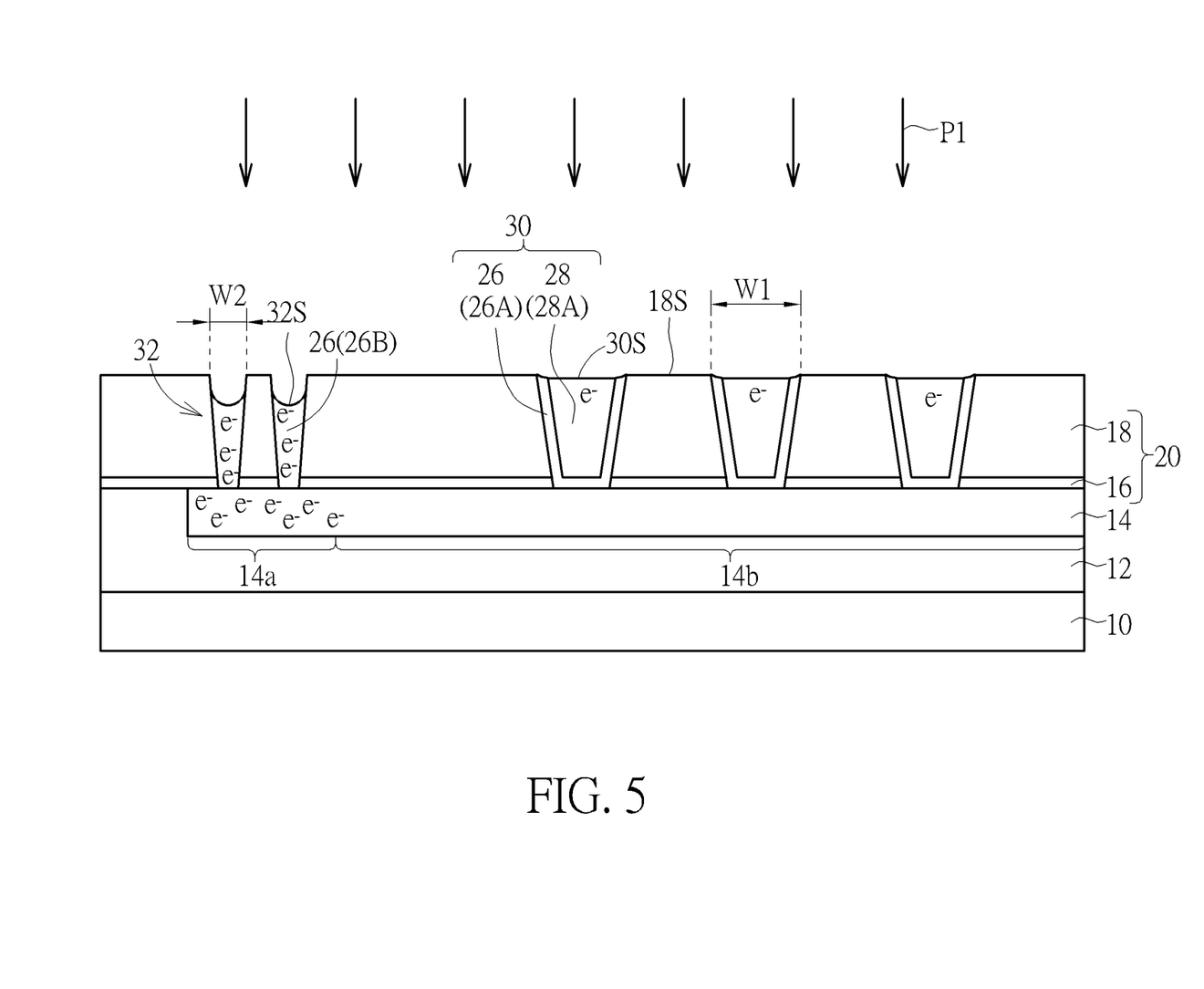

Please refer to FIG. 5. Subsequently, a chemical mechanical polishing (CMP) process P1 is performed to remove the conductive material layer 25 outside the first openings 22 and the second openings 24 until the surface of the second dielectric layer 20 (that is, the surface 18S of the dielectric material layer 18) is exposed, thereby obtaining the conductive vias 30 in the first openings 22 and the dummy vias 32 in the second openings 24. The widths of the conductive vias 30 are determined by the widths of the first openings 22, and the widths of the dummy vias 32 are determined by the widths of the second openings 24. According to an embodiment of the present invention, the conductive vias 30 may approximately have the first width W1 of the first openings 22, and the dummy vias 32 may approximately have the second width W2 of the second openings 24 that is smaller than 50% of the first width W1 of the conductive vias in the cross-sectional view as shown in FIG. 5.

Please continue to refer to FIG. 5. Each of the conductive vias 30 may include a first filling metal 28A and a liner 26A disposed between the first filling metal 28A, the conductive structure and the second dielectric layer 20. The first filling metal 28A is formed from the second metal layer 28. The liner 26A is formed from the first metal layer 26. In this embodiment, each of the dummy vias 32 may mostly include a second filling metal 26B. The second filling metal 26B is formed from the first metal layer 26.

The metal material of the conductive vias 30 and the metal materials of the dummy vias 32 are electrically connected through the conductive structure 14. When both of the metal material of the conductive vias 30 and the metal materials of the dummy vias 32 are exposed to the polishing slurry during the CMP process P1, an electrochemical system involving electron current and chemical reaction (metal materials are oxidized by the oxidant of the polishing slurry) may be established. It is noteworthy that, the dummy vias 32 having the second width W2 sufficiently smaller than the first width W1 of the conductive vias 30 (preferably, the second width W2 is smaller than 50% of the first width W1) may have the function of gathering the electrons (marked as $e^-$), so that less electrons may accumulate at the conductive vias 30. In this way, the galvanic corrosion is less likely to occur at the conductive vias 30, and the problem of excessive removal of the metal material of the conductive vias 30 may be reduced.

According to an embodiment of the present invention, as shown in FIG. 5, the surface 30S (the surface of the first filling metal 28A of the conductive via 30 may be substantially flush with or slightly lower than the surface of the second dielectric layer 20 (the surface 18S of the dielectric material layer 18). The dummy via 32 may show obvious galvanic corrosion because of electron gathering, so that the surface 32s (the surface of the second filling metal 26B) of the dummy via 32 may have a recessed profile and is lower than the surface 30S of the conductive via 30.

Figure 6:
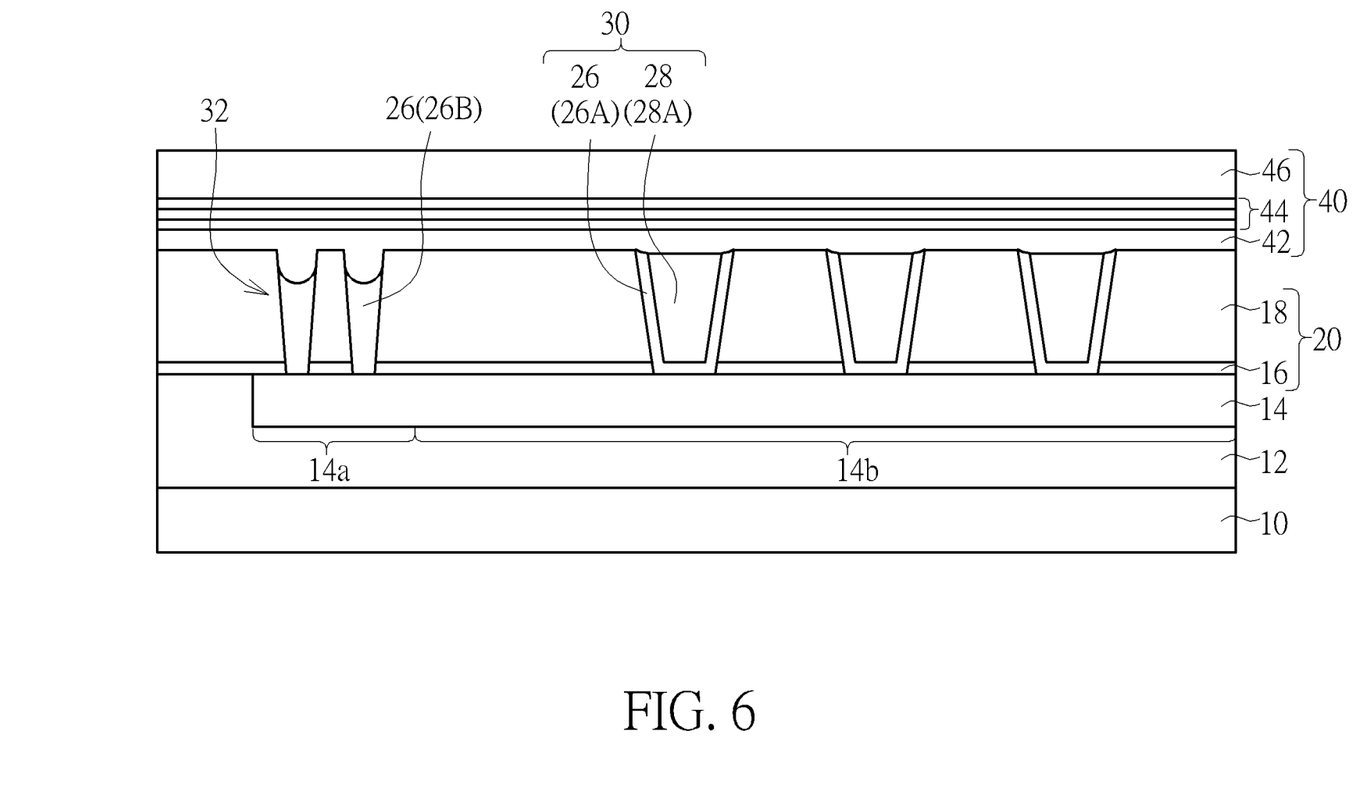

Please refer to FIG. 6. Subsequently, a memory stack layer 40 is formed on the second dielectric layer 20 and the conductive vias 30 and the dummy vias 32 in a blanket manner. According to an embodiment of the present invention, the memory stack layer 40 may include a bottom electrode material layer 42, a memory layer 44 disposed on the bottom electrode material layer 42, and a top electrode material layer 46 on the memory layer 44. The bottom electrode material layer 42 directly contacts the conductive vias 30 and the dummy vias 32. The bottom electrode material layer 42 and the top electrode material layer 46 respectively include a conductive material, such as titanium (Ti), tantalum (Ta), titanium nitride (TiN), tantalum nitride (TaN), or a combination thereof, but are not limited thereto. The memory layer 44 may include a magnetic tunneling junction (MTJ) of a magnetic random access memory (MRAM), a variable resistance layer of a resistive random access memory (RRAM), or other types of memory layers. According to an embodiment of the present invention, the memory layer 44 includes a magnetic tunneling junction (MTJ).

Figure 7:
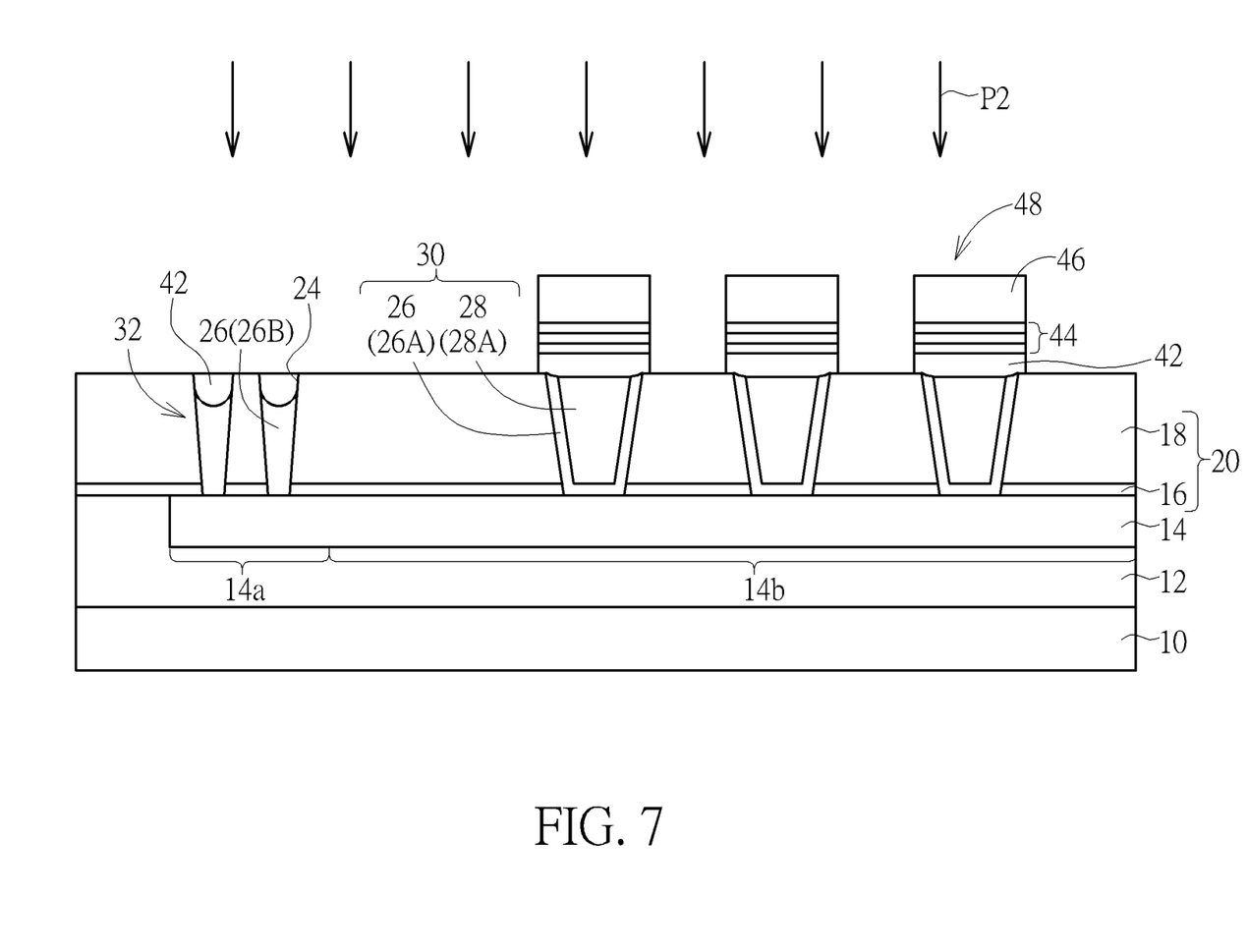

Please refer to FIG. 7. Subsequently, a patterning process P2 may be performed to the memory stack layer 40 to form memory cell structures 48 respectively and directly on the conductive vias 30. The portion of the memory stack layer 40 directly on the dummy vias 32 (directly on the terminal portion 14a of the conductive structure 14) is removed by the patterning process P2, and the patterns of the second openings 24 may be exposed. According to an embodiment of the present invention, as shown in FIG. 7, portions of the bottom electrode material layer 42 may remain on the dummy vias 32 and fill the upper portions of the second openings 24. In this case, the surfaces 32S of the dummy vias 32 (the surfaces of the second filling metals 26B) are covered by the remaining portions of the bottom electrode material layer 42.

Figure 8:
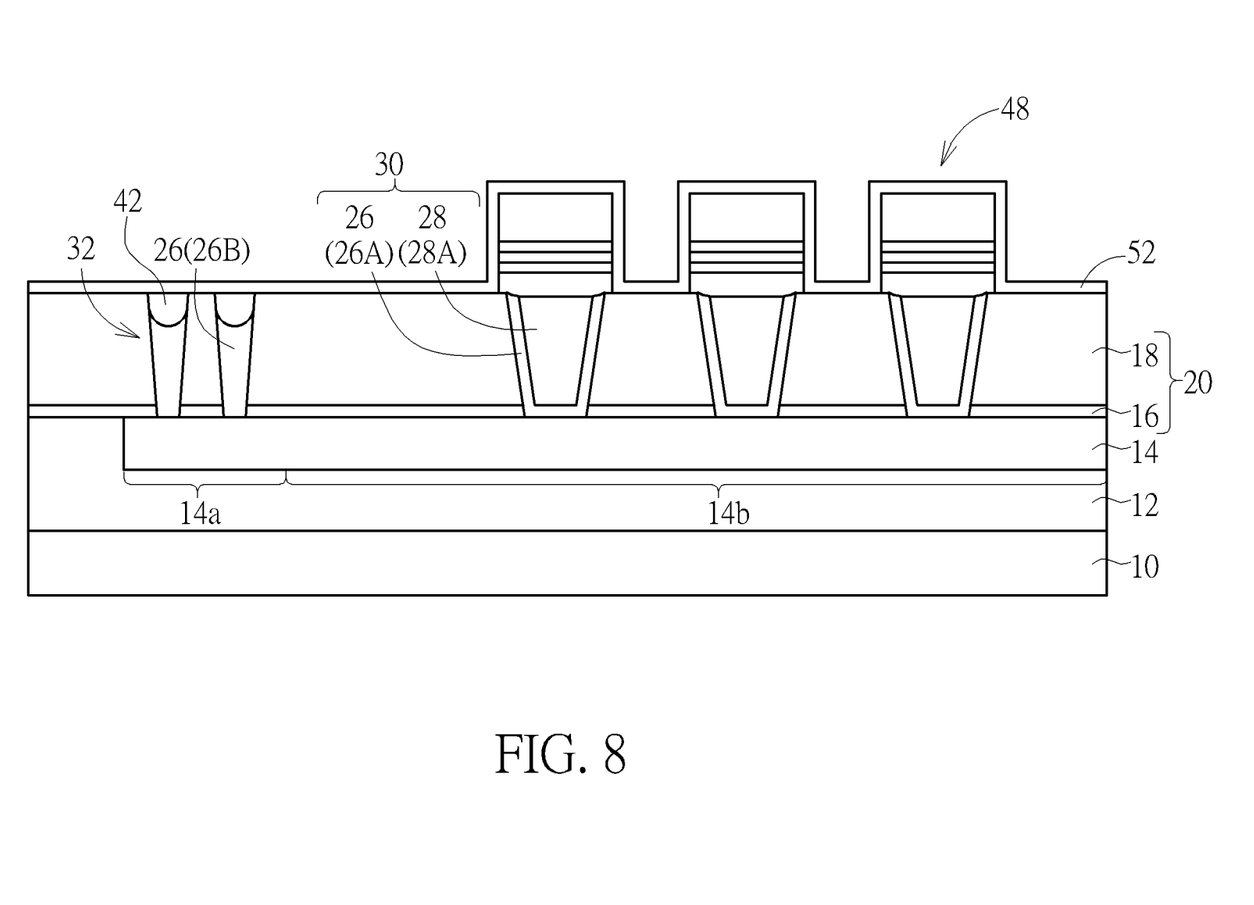

Please refer to FIG. 8. Subsequently, a chemical vapor deposition (CVD) may be performed to form a passivation layer 52 on the second dielectric layer 20. The passivation layer 52 conformally covers the surface of the second dielectric layer 20 and sidewalls and top surfaces of the memory cell structures 48, and completely covers the dummy vias 32. The material of the passivation layer 52 may include insulating materials such as silicon nitride (SiN), silicon oxynitride (SiON), silicon carbon nitride (SiCN), or a combination thereof, but is not limited thereto.

In the present invention, by providing the dummy vias 32 on the terminal portion 14a of the conductive structure 14, the problem of excessive removal of the metal material of the conductive vias 30 due to galvanic corrosion may be reduced. The surfaces of the first filling metals 28A of the conductive vias 30 may be substantially flush with or only slightly lower than the surface of the second dielectric layer 20. In this way, the interconnection between the filling metals 28A of the conductive vias 30 and the bottom electrode material layers 42 of the memory cell structures 48 may be ensured.

Figure 9:
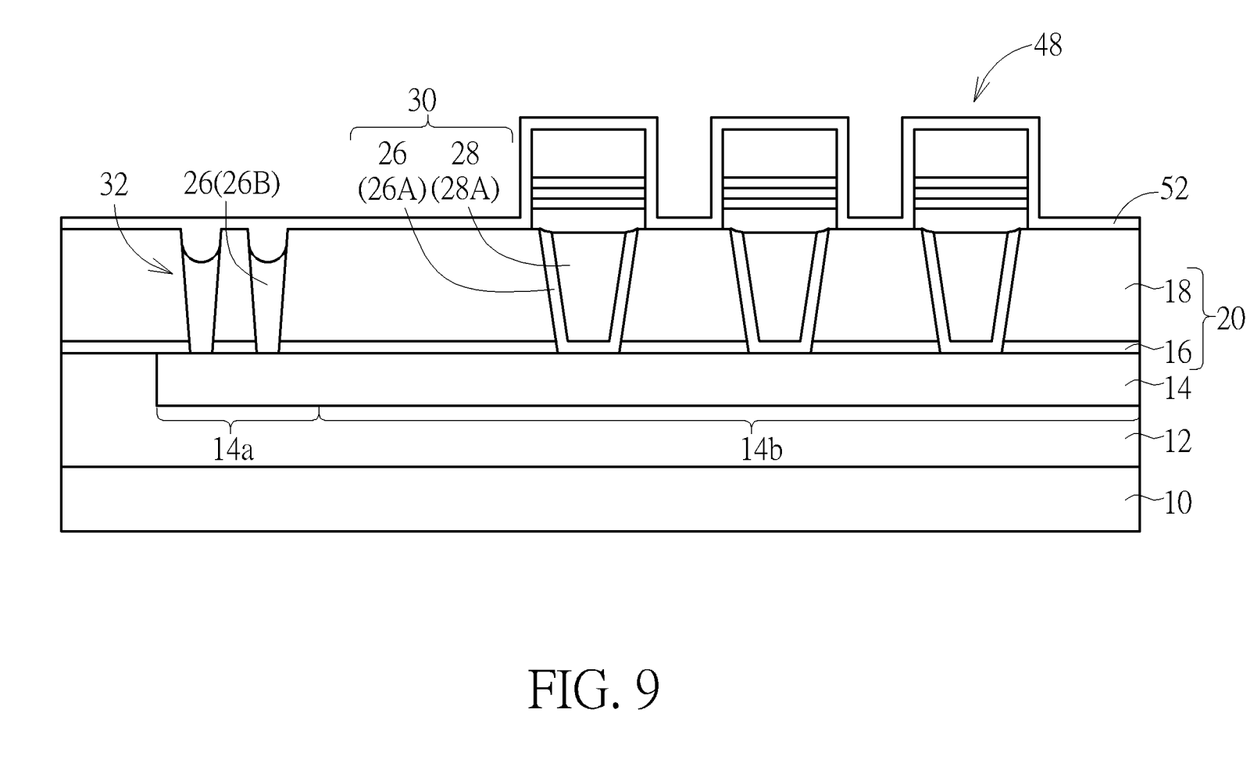
FIG. 9 is a schematic cross-sectional diagram illustrating a semiconductor structure according to another embodiment of the present invention.

Please refer to FIG. 9, which is a cross-sectional diagram illustrating a semiconductor structure according to an embodiments of the present invention. The difference between the embodiment shown in FIG. 9 and the embodiment shown in FIG. 8 is that, the portions of the bottom electrode material layer 42 on the dummy vias 32 are completely removed during the patterning process P2 (the step shown in FIG. 7). Accordingly, the passivation layer 52 may fill into the upper portions of the second openings 24 and directly contacts the surfaces of the second filling metals 26B of the dummy vias 32.

Figure 10:
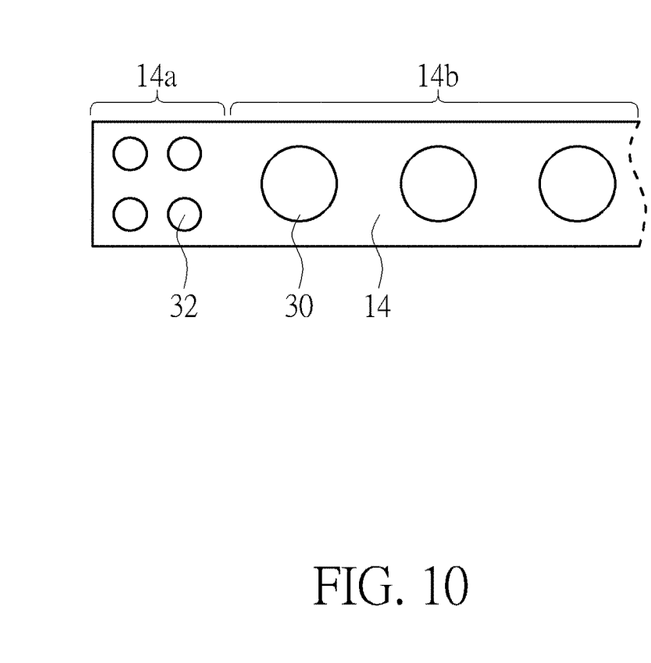
FIG. 10, FIG. 11 and FIG. 12 are schematic plan views illustrating semiconductor structures according to some embodiments of the present invention.
Figure 11:
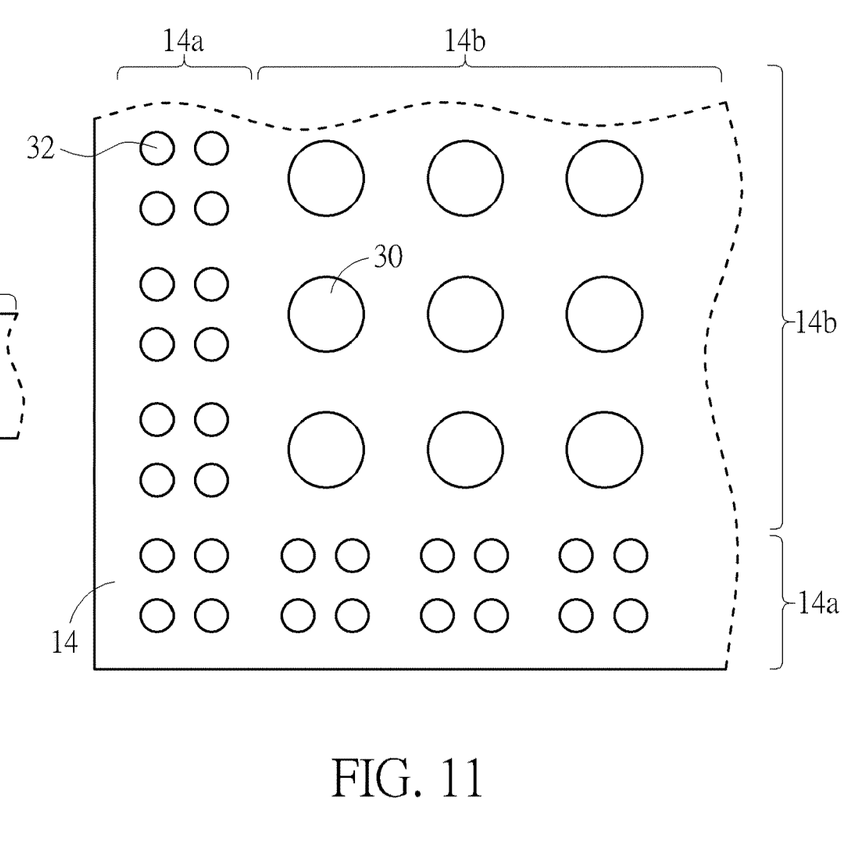
Figure 12:
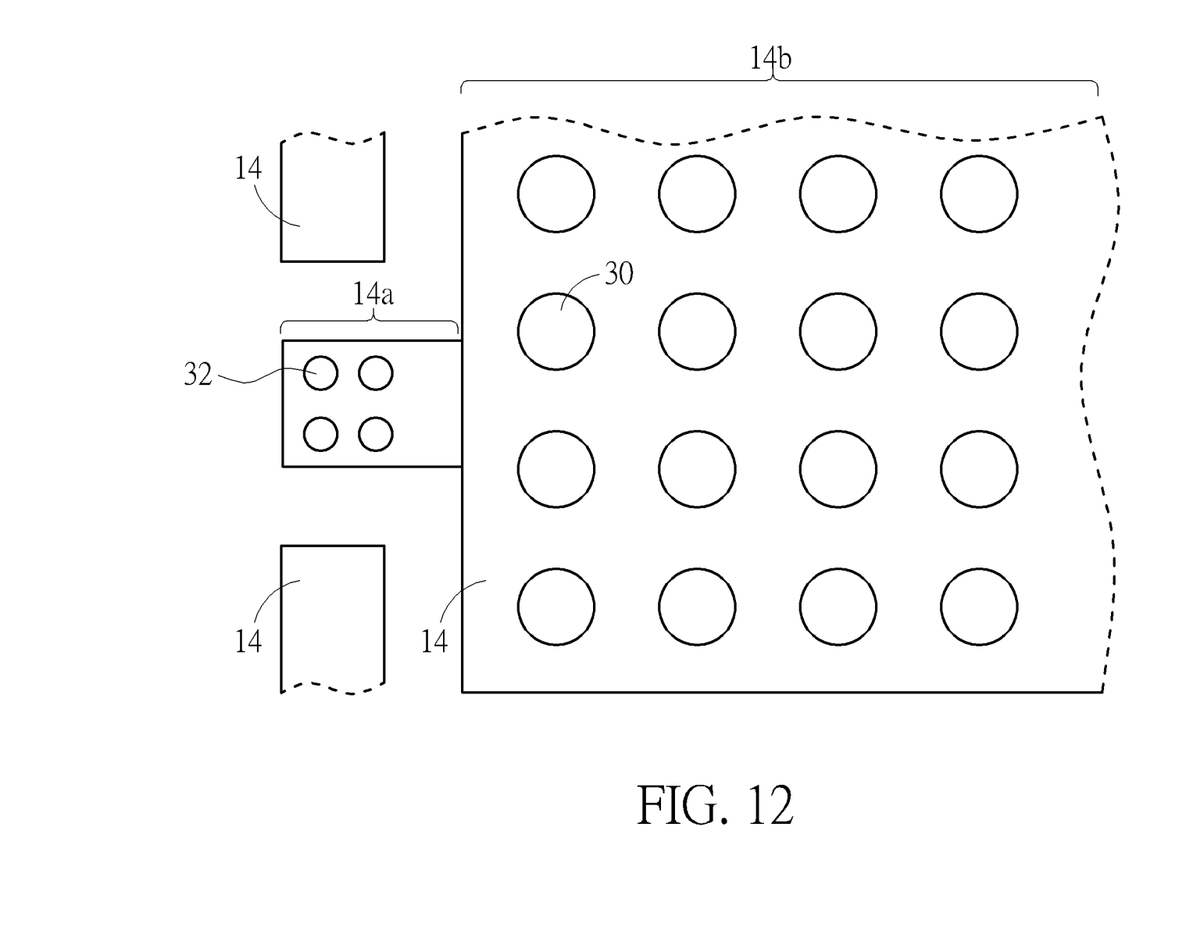

FIG. 10, FIG. 11 and FIG. 12 are schematic plan views illustrating semiconductor structures according to some embodiments of the present invention. It should be understood that the numbers of the dummy vias and conductive vias shown in FIG. 10, FIG. 11 and FIG. 12 are only examples and are not limitations to the present invention.

Please refer to FIG. 10. The conductive structure 14 may be a portion of a conductive line and includes a terminal portion 14a and an extending portion 14b connecting a side of the terminal portion 14a and extending away from the terminal portion 14a. A plurality of conductive vias 30 are disposed on the extending portion 14b, and a plurality of dummy vias 32 are disposed on the terminal portions 14a.

Please refer to FIG. 11. The conductive structure 14 may be a portion of a conductive plate. The terminal portion 14a is the portion near the edge of the conductive plate. The extending portion 14b is the portion of the conductive plate surrounded by the terminal portion 14a. A plurality of conductive vias 30 are disposed on the extending portion 14b, and a plurality of dummy vias 32 are disposed on the terminal portions 14a and arranged along the edge of the conductive structure 14.

Please refer to FIG. 12. In some embodiments, when the spaces between the conductive vias 30 and the edge of the conductive structure 14 is not large enough for the dummy vias 32, an outward extending portion (the terminal portion 14a in FIG. 12) may be additional formed on the edge of the conductive structure 14, and the dummy vias 32 may be disposed on the outward extending portion. The dummy vias 32 on the outward extending portion may also provide the function of gathering the electrons and reducing galvanic corrosion of the conductive vias 30.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a first dielectric layer on a substrate;
   a conductive structure disposed in the first dielectric layer and comprising:
      a terminal portion; and
      an extending portion directly and physically connected to the terminal portion and extending away from the terminal portion;
   a second dielectric layer disposed on the first dielectric layer;
   a conductive via through the second dielectric layer and directly contacting the extending portion; and
   a dummy via through the second dielectric layer and directly contacting the terminal portion, wherein in a cross-sectional view, a width of the dummy via is smaller than 50% of a width of the conductive via, a top surface of the dummy via is lower than a top surface of the conductive via, and the top surface of the conductive via is lower than a top surface of the second dielectric layer.

2. The semiconductor structure according to claim 1, wherein the width of the dummy via is between 20% and 40% of the width of the conductive via.

3. The semiconductor structure according to claim 1, further comprising:
   a memory cell structure on the conductive via; and
   a passivation layer on the second dielectric layer and the dummy via and covering a sidewall and a top surface of the memory cell structure.

4. The semiconductor structure according to claim 3, wherein the passivation layer directly contacts the top surface of the dummy via.

5. The semiconductor structure according to claim 3, further comprising a bottom electrode material layer disposed on the dummy via, wherein the passivation layer directly contacts a top surface of the bottom electrode material layer.

6. The semiconductor structure according to claim 1, wherein the conductive via comprises a first filling metal and a liner disposed between the first filling metal and the second dielectric layer, the dummy via comprises a second filling metal, wherein the liner and the second filling metal comprise a same material.

7. The semiconductor structure according to claim 6, wherein the first filling metal comprises tungsten (W), the second filling metal and the liner comprise titanium nitride (TiN).

8. The semiconductor structure according to claim 6, wherein a top surface of the second filling metal is lower than a top surface of the first filling metal.

* * * * *